United States Patent [19]

Germer et al.

[11] Patent Number: 4,673,872

[45] Date of Patent: Jun. 16, 1987

[54] PACKAGING FOR ELECTRONIC DEMAND REGISTER

[75] Inventors: Warren R. Germer; Peter F. Losapio, both of Dover, N.H.

[73] Assignee: General Electric Company, Somersworth, N.H.

[21] Appl. No.: 659,687

[22] Filed: Oct. 11, 1984

[51] Int. Cl.[4] ............................................. G01R 11/04
[52] U.S. Cl. .............................. 324/103 R; 235/1 D; 361/364
[58] Field of Search ........................... 324/103 R, 142; 235/1 D; 361/364, 369, 372, 392, 395, 399, 397, 408

[56] References Cited

U.S. PATENT DOCUMENTS

| | | | |
|---|---|---|---|
| 3,766,513 | 10/1973 | Carre | 339/176 M X |
| 4,092,698 | 5/1978 | Brefka | 361/399 |
| 4,368,519 | 1/1983 | Kennedy | 324/113 X |
| 4,379,606 | 4/1983 | Clark et al. | 339/17 CF |
| 4,431,966 | 2/1984 | Pucciarello | 324/114 |
| 4,491,789 | 1/1985 | Benbow | 324/113 |

Primary Examiner—Reinhard J. Eisenzopf
Assistant Examiner—Stephen M. Baker
Attorney, Agent, or Firm—Robert E. Brunson; Thomas R. Morrison

[57] ABSTRACT

A modular electronic demand register for an electric meter is enclosed in an insulating housing into which substantially all components are installable by drop-in, snap-together methods. A display is dropped into the housing and metallic contact pads thereof are interconnected with corresponding metallic contact pads on a printed circuit board using a resilient contact strip of a type having parallel longitudinal resilient conductors insulated from each other by an insulating resilient matrix. The as-formed contact strip is slightly longer than the distance between the two sets of metallic contact pads which it interconnects, whereby, when the printed circuit board is tightened in place, the contact strip is compressed slightly to provide a stable, resiliently urged fit. Guide surfaces on the electronic demand register cooperate with surfaces on the remainder of the electric meter to guide the electronic demand register into its operational position and to lock it in place. A connector contains pins of different lengths so that, when installing the demand register, the power connections are made last and when removing the demand register, the power connections are broken first.

7 Claims, 12 Drawing Figures

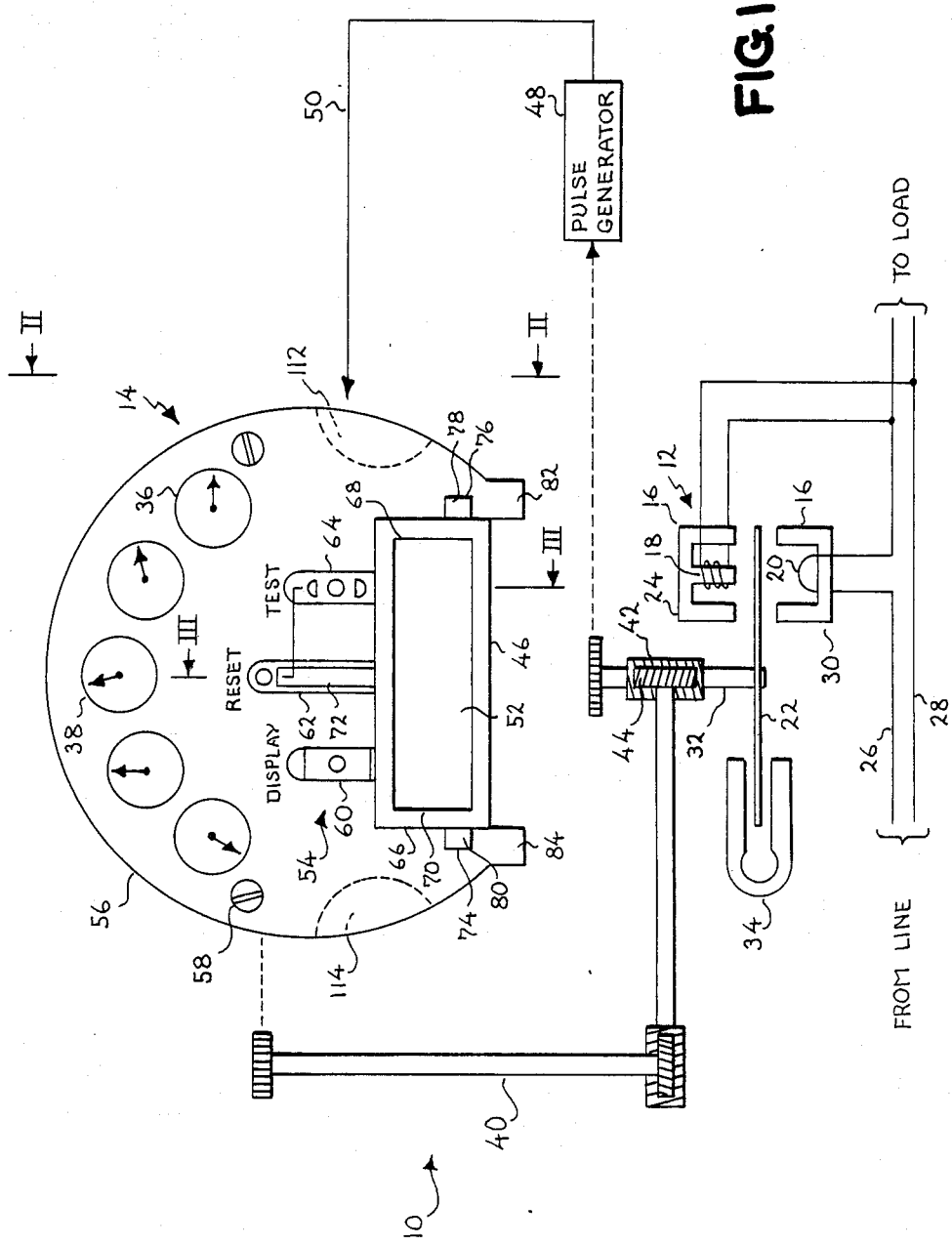

PACKAGING FOR ELECTRONIC DEMAND REGISTER

BACKGROUND OF THE INVENTION

The present invention relates to electric meters containing electronic demand registers and, more particularly, to physical construction of electronic demand registers adapted for ease of assembly and efficient integration with their electric meters.

Conventional electric meters employ an aluminum disk driven as a rotor of a small induction motor by an electric field at a speed which is proportional to the electric power being consumed by a load. Geared dials, or cyclometer discs, integrate the disk motion to indicate the total energy consumed, conventionally measured in kilowatt hours (one kilowatt hour equals one thousand watts of power consumption for one hour).

In addition to the above measurement of consumption, some electric meters contain means for separating the consumption into those parts of consumption occurring during predetermined peak and off-peak hours and for recording maximum demand during a predetermined period of time in order to adjust billing according to such parameters. In one such demand meter disclosed in U.S. Pat. No. 3,586,974, a mechanical demand register records the power usage during a predetermined period of time and stores the value for later reading. The predetermined period of time may be, for example, the time between meter readings, or a period of time corresponding to the billing period of the utility providing the power. A clockwork mechanism restarts the demand register at the ends of regular demand intervals of, for example, a fraction of an hour, so that, at the end of the predetermined period, the stored value represents the highest value of power usage occurring during any one of the regular demand intervals in the predetermined period.

Mechanical demand registers, such as disclosed in the above U.S. Patent, have limited flexibility. The design of a particular meter physical configuration is not transferable to another meter having a different physical configuration. In addition, the demand-measurement functions of a particular demand register cannot be redefined without major mechanical redesign. Greater flexibility may be obtained using electronic acquisition, integration and processing of power usage. An electronic processor such as, for example, a microprocessor, may be employed to manage the acquisition, storage, processing and display of the usage and demand data. U.S. Pat. Nos. 4,179,654; 4,197,582; 4,229,795; 4,283,772; 4,301,508; 4,361,872 and 4,368,519, among others, illustrate the flexibility that electronic processing brings to the power and energy usage measurement. Each of these electronic measurement devices includes means for producing an electronic signal having a characteristic such as, for example, a frequency or a pulse repetition rate, which is related to the rate of power usage. The electronic processor is substituted for the mechanical demand register of the prior art to keep track of the power usage during defined periods of time.

Various aspects of an electronic demand register which may benefit from the packaging technique of the present invention are disclosed in U.S. patent applications Ser. Nos. 599,684, U.S. Pat. Nos. 4,571,692; 599,685, 4,627,000; 599,736, 4,591,782; 599,744, 4,625,163; 599,683, 4,573,141; 599,735, 4,598,248; 599,743, 4,594,545; 599,742, 4,620,150 all filed on Apr. 12, 1984 and Ser. Nos. 550,407, now abandoned; 550,142, now abandoned both filed on Nov. 10, 1983 the disclosures of which are herein incorporated by reference. For present purposes, it is sufficient to state that one desirable characteristic of an electronic demand register should be ease of manufacture using snap-together assembly techniques. In addition, since the electronic demand register is called on to perform many functions, it necessarily requires the inclusion of a large number of parts when compared to the number of parts in the electro-mechanical portion of the electric meter. As a consequence, it can be anticipated that an electronic demand register of an electric meter may require field service more often than the remainder of the electric meter. Thus, a second important desirable characteristic of an electronic demand register is ease of troubleshooting and service.

The mechanical kilowatthour register of an electric meter must accommodate a plurality of different voltages and loads. The line voltage available for driving the aluminum disk of a particular installation is accommodated by a suitable choice of a voltage coil in the electric meter. Different loads are accommodated by selecting a desired relationship between disk rotation and mechanical dial readings through the use of scaling by mechanical gearing. In this way, a single basic electro-mechanical design of an electric meter is adaptable to a large number of installation-specific applications.

It is desirable to provide an improved electronic demand register having corresponding, or greater, universality of use in installation-specific situations. Such universality is achieved in the referenced demand register through the use of programmed constants which perform scaling corresponding to that performed by mechanical gearing, and perform other functions for adapting a universal electronic demand register design to a particular installation. The programmed constants reside in the volatile memory of a digital processor during normal operation and are transferred to an on-board, non-volatile memory upon the occurrence of a real or apparent power outage, as well as upon a limited number of other types of occurrences. Removal of the electronic demand register from the electric meter is recognized as an apparent power outage triggering the non-volatile storage of the programmed constants. In addition, existing billing data is also stored in the non-volatile memory.

A favored technique for field service on an electronic demand register includes substitution of a known-good demand register for one that is apparently in a failed condition. In order to avoid the need to reprogram the programmed constants for a particular application, and to avoid losing stored billing data, a method was disclosed in the referenced patent applications for copying the contents of a non-volatile storage in one electronic demand register to a non-volatile storage in another electronic demand register which may then be substituted for the original electronic demand register. It is desirable that the package for an electronic demand register provide a suitable interface for a programmer which is capable of reading the contents of a non-volatile storage in an electronic demand register which is to be replaced and for writing the thus-acquired data into a non-volatile storage in a replacement electronic demand register.

In order to reduce the cost of an electronic demand register, it is desirable to eliminate the need for a transformer therein to adapt the electronic demand register to the voltage existing in the installation. A convenient way of eliminating a transformer includes employing dropping resistors of an appropriate resistance to reduce the line voltage to a desired standard value. Such dropping resistors are disclosed in the referenced patent applications. When dropping resistors are substituted for transformers, additional precautions are desirable to avoid accidental contact between people and conductive materials in the electronic demand register.

OBJECTS AND SUMMARY OF THE INVENTION

It is an object of the invention to provide a package for an electronic demand register which satisfies the requirements of manufacturability, serviceability and safety noted hereinabove.

It is a further object of the invention to provide a package for an electronic demand register which employs substantial drop-in, snap-together assembly techniques to reduce manufacturing cost.

It is a further object of the invention to provide a package for an electronic demand register which includes an exterior of non-conducting material.

It is a still further object of the invention to provide a package for an electronic demand register in which a contact area for a display is disposed a substantial distance away from a contact area of a circuit board which produces control signals therefor. Electrical connection between the two contact areas is made through a resilient contact strip of the type having longitudinal parallel resilient conductors insulated from each other by a resilient insulating matrix.

It is a further object of the invention to provide a connector for a modular electronic demand register in which pins carrying AC power are shorter than a remainder of the pins whereby power connection is made last during installation and is broken first during removal of the electronic demand register.

It is a still further object of the invention to provide a package for an electronic demand register which includes guide surfaces integrally formed thereon. The guide surfaces cooperate with portions of the electric meter to guide the demand register into its operational position within an electric meter.

It is a still further object of the invention to provide a demand register having guide surfaces as described above and further to provide sawtooth ramps on the demand register which cooperate with locking notches in the electric meter to lock the demand register in its operational position but also permit the easy removal thereof upon deflection of the locking notches out of contact with the sawtooth ramps.

Briefly stated, the present invention provides a modular electronic demand register for an electric meter enclosed in an insulating housing into which suhstantially all components are installable by drop-in, snap-together methods. A display is dropped into the housing and metallic contact pads thereof are interconnected with corresponding metallic contact pads on a printed circuit board using a resilient contact strip of a type having parallel longitudinal resilient conductors insulated from each other by an insulating resilient matrix. The as-formed contact strip is slightly longer than the distance between the two sets of metallic contact pads which it interconnects, whereby, when the printed circuit board is tightened in place, the contact strip is compressed slightly to provide a stable, resiliently urged fit. Guide surfaces on the electronic demand register cooperate with surfaces on the remainder of the electric meter to guide the electronic demand register into its operational position and to lock it in place. A connector contains pins of different lengths so that, when installing the demand register, the power connections are made last and when removing the demand register, the power connections are broken first According to an embodiment of the invention, there is provided a modular demand register for an electric meter comprising a non-conductive housing, the housing including at least one recess for receiving a display, a display in the at least one recess, a circuit board in the housing containing a substantial part of an electronic circuit of the demand register, means for affixing the circuit board in the housing generally parallel to, and displaced from, the display, means for interconnecting the circuit board and the display for operation of the display, means for connecting the circuit board to external circuits, a non-conductive back cover for the housing, the housing and the back cover being effective for enclosing all conductive parts of the demand register which may receive power when the demand register is in an operational position within an electric meter, and means for snapping the back cover in place on the housing whereby assembly of the demand register is simplified.

According to a feature of the invention, there is provided a register for an electric meter comprising a support structure, a plate on the register, means for supporting the plate on the support structure, a modular electronic demand register, a cavity behind the plate for receiving the modular demand register, a first slot in the plate, the first slot including first and second parallel edges, at least a second slot in the plate extending contiguously from the first slot in a direction parallel to the first and second parallel edges, the second slot including third and fourth edges parallel to the first and second edges, first and second locking notches in the plate extending transversely contiguously from the first and second edges respectively, a housing on the modular demand register, the housing including at least first, second, third and fourth guide surfaces extending outward therefrom, the first, second, third and fourth guide surfaces being guidably slideable on the first, second, third and fourth edges for guiding the modular demand register into the cavity, first and second locking ramps on the housing, the plate being free to permit outward deflection thereof in the vicinity of the first and second locking notches, the first and second locking ramps being positioned to deflect the plate outward during insertion of the modular demand register into the electric meter and to lockingly engage the first and second locking notches when the modular demand register is in its operational position, an electrical connector in the register, a plurality of connector pins in the modular demand register, and a cooperation between the first, second, third and fourth edges and the first, second, third and fourth guide surfaces being effective to provide guidance for guiding a mating of the connector pins into the electrical connector during insertion of the modular demand register in the cavity.

The above, and other objects, features and advantages of the present invention will become apparent from the following description read in conjunction with the accompanying drawings, in which like reference numerals designate the same elements.

BRIEF DESCRIPTION OF THE DRAWINGS

FIG. 1 is a schematic diagram of an electric meter containing an electronic demand register according to an embodiment of the invention.

DETAILED DESCRIPTION OF THE PREFERRED EMBODIMENT

Figure 4:
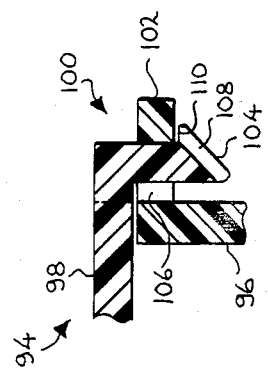
FIG. 4 is a cross section of a hook-type fastener taken along IV—IV in FIG. 2.

Although the present invention may be adapted to any suitable style of electric meter which employs an element rotating at a speed proportional to power consumption, including single phase meters with one or more current windings and polyphase meters, for concreteness, the detailed description which follows is directed toward an illustrative example of a 2-wire single phase meter of the type having a single current coil and a single voltage coil.

Referring now to FIG. 1, there is shown, generally at 10, an electric meter which includes a small induction motor 12 driving a register 14. Induction motor 12 includes a stator 16 made up of a voltage coil 18 and a current coil 20 disposed on opposite sides of a disk 22. Voltage coil 18 employs a core 24 upon which is wound a large number of turns of fine wire. Voltage coil 18 is connected across lines 26 and 28 which feed power to a load (not shown). Current coil 20 employs a core 30 upon which a small number of turns, typically one or two, of heavy conductor are wound. Current coil 20 is connected in series with the power being fed to the load on line 26

Disk 22 is affixed to a shaft 32 which is supported on suitable bearings (not shown) to permit concerted rotation of disk 22 and shaft 32 under the influence of a rotating magnetic field produced by the combined influence of voltage coil 18 and current coil 20. A permanent magnet 34, having its poles disposed on opposite sides of disk 22, applies a retarding force which is proportional to the rotational speed of disk 22. The rotational torque produced by voltage coil 18 and current coil 20, combined with the retarding torque produced by permanent magnet 34, is effective to rotate disk 22 at a speed which is proportional to the product of the voltage and the current; that is, the power, consumed by the load.

Register 14 includes a watthour register 36 which may include, for example, a plurality of dials 38 which are suitably geared and driven by a suitable mechanical coupling 40 in proportion to the rotation of shaft 32. In the embodiment shown, mechanical coupling 40 includes a worm 42, which may be integrally formed in shaft 32, which engages and rotates a worm gear 44. Additional elements may be present in mechanical coupling 40 for coupling the rotation of worm gear 44 to watthour register 36 with or without change in speed and direction according to the design of the particular electric meter 10. As is conventional, watthour register 36 totals the number of revolutions of shaft 32, suitably scaled by the gear ratios employed, for billing purposes.

A demand register 46 in electric meter 10 receives pulses from a pulse generator 48 on a line 50 in response to the rotation of shaft 32. Demand register 46 is modular in the sense that it can be inserted into, and removed from, register 14 as a unit. Demand register 46 includes a display 52 of any convenient type such as, for example, a liquid crystal display, for presenting billing and troubleshooting data to a user. In addition, demand register 46 includes a set of control switches 54 whose functions are described more fully in the referenced patent applications. Demand register 46 is insertable into register 14 by sliding it straight upward in FIG. 1 to the position shown. The act of sliding demand register 46 into position is effective for making all necessary electrical connections thereto and for locking it in place, as will be more fully described hereinafter.

A metallic plate 56, preferably of sheet metal and most preferably of aluminum, covers a face of register 14 and optionally provides a surface upon which necessary indicia may be printed or otherwise included thereon. Metallic plate 56 is affixed to a foundation structure (not shown) of electric meter 10 by at least first and second screws 58. The lower portion of metallic plate 56 is without screws or other fasteners for holding it to the foundation structure and is thereby capable of being deflected outward as part of the system for securing demand register 46 in place. Three vertical slots 60, 62 and 64 are disposed in metallic plate 56 joining a rectangular slot 66 opening to the bottom of metallic plate 56.

Figure 2:
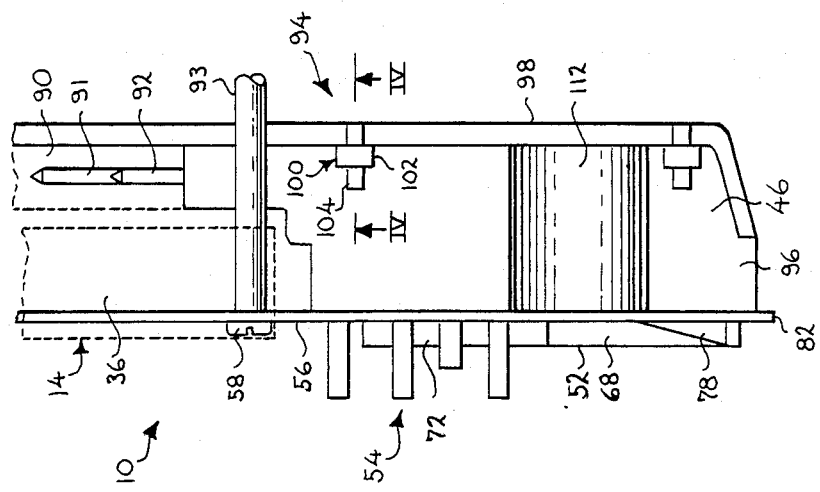
FIG. 2 is a side view of a part of the electric meter of FIG. 1 taken along II—II in FIG. 1.

Referring now also to the side view of electric meter 10 in FIG. 2, sides 68 and 70 (only side 68 is shown in FIG. 2) extend outward through rectangular slot 66 and provide guide surfaces for guiding demand register 46 into place within register 14. A guide boss 72 extends outward from demand register 46 through vertical slot 62 for providing further guidance for fitting demand register 46 into register 14 while sliding it upward into place therein. Locking notches 74 and 76 open transversely from opposed sides of rectangular slot 66. Locking ramps 78 and 80 (only locking ramp 78 is shown in FIG. 2) fit within locking notches 76 and 74 respectively for locking demand register 46 into its operational position, shown in FIGS. 1 and 2. During the act of sliding demand register 46 upward into the operational position shown, locking ramps 78 and 80 outwardly deflect the lower unsecured portion of metallic plate 56 until locking ramps 78 and 80 are fully seated within locking notches 76 and 74 respectively. At that point, metallic plate 56 snaps back into its undeflected position to lock demand register 46 in position.

A pair of finger tabs 82 and 84 extend downward past the lower extremity of demand register 46 to permit a worker to slightly deflect the lower unsecured portion of metallic plate 56 outward thereby releasing the lock provided by locking ramps 78 and 80 in locking notches 76 and 74 respectively and thus to permit demand register 46 to be withdrawn downward out of register 14 for troubleshooting, replacement or other purposes.

Referring now specifically to FIG. 2, it will be noted that watthour register 36, being conventional and not representing an inventive part of the present disclosure, is shown in dashed line only for the purpose of indicating its location relative to the elements being discussed. In addition, a conventional electrical connector 90 is also shown in dashed line. Electrical connection to electrical connector 90 is made by a plurality of short connector pins 92 (only two of which are shown in FIG. 2). It will be noted that short connector pin 92 is substantially shorter than long connector pin 91. Thus, when inserting demand register 46 into register 14, long connector pin 91, and all other pins of the same length, make electrical contact with external circuits before short connector pin 92, and all others of the same length, make electrical contact. Conversely, when removing demand register 46 from register 14, this arrangement ensures that short connector pin 92, and its brothers, break contact before long connector pin 91 and its brothers. This pin arrangement may be useful when demand register 46 provides external outputs to, for example, pulse initiators or other apparatus for local or remote monitoring or indication of data produced by demand register 46. Short connector pin 92 may, for example, be employed to connect AC power to demand register 46 whereas long connector pin 91 may be used to connect monitoring data from demand register 46. Thus, when demand register 46 is inserted into register 14, all other connections are securely made before power can be connected to demand register 46. When demand register 46 is removed, power connections are broken first.

A further support structure (not shown) of electric meter 10, as well as induction motor 12, register 14 and pulse generator 48, is, of course, present in electric meter 10, but is omitted herefrom since its illustration and description would not add to the disclosure of the invention contained herein but would merely add clutter and obscure the present disclosure. One or more conventional posts 93, only an exemplary one of which is illustrated, may be employed to support register 14 to such support structure.

Figure 3:
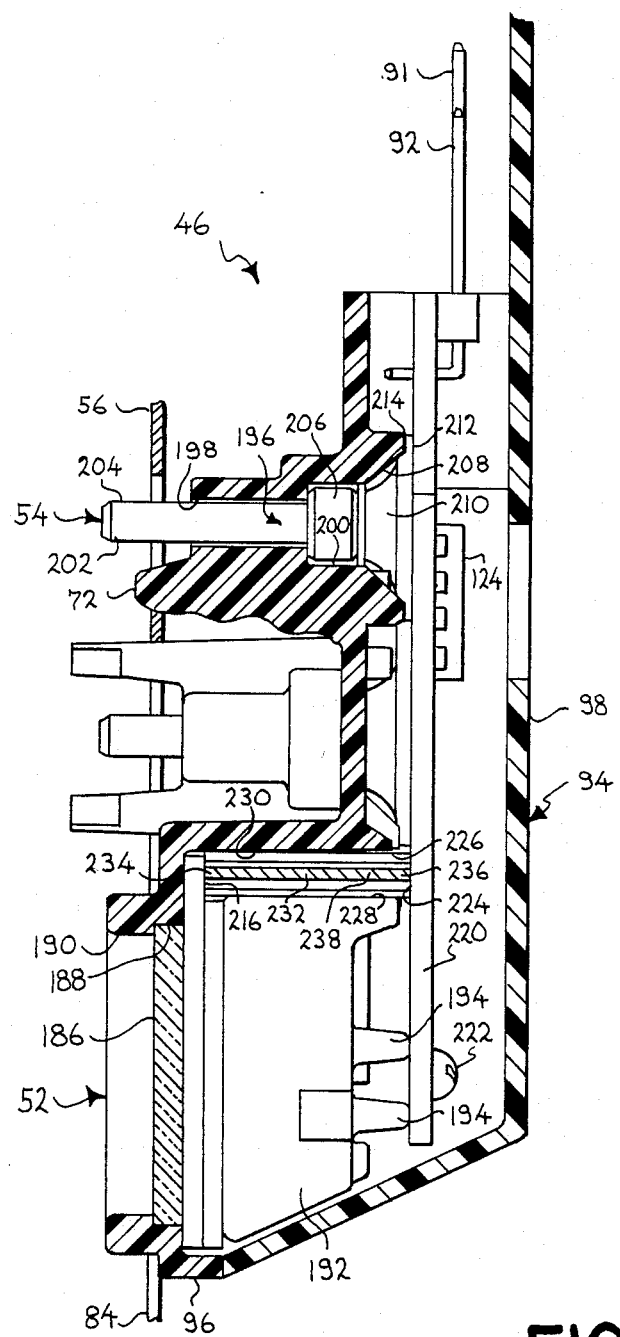
FIG. 3 is a cross section of the demand register taken along III—III in FIG. 1.

Referring now also to the cross section shown in FIG. 3, demand register 46 is enclosed in a housing 94 which consists of a main body 96 and a back cover 98. Main body 96 and back cover 98 are preferably made of a non-conducting plastic material and most preferably of a polycarbonate plastic material for the high value of strength and impact resistance provided by such material. Referring momentarily to FIG. 4, back cover 98 is attached to main body 96 using a plurality of hook-type fasteners 100. Hook-type fastener 100 includes a loop 102 integrally molded with, and extending transversely from, main body 96 adjacent to its abutment with back cover 98. A mating part of hook-type fastener 100 includes a hook 104 integrally molded with, and extending both outward and downward from, back cover 98 into general alignment with loop 102. Loop 102 includes an opening 106 therein. Hook 104 includes an inclined surface 108 and a step 110. Opening 106 has a width sufficient to permit the widest part of hook 104 to pass therethrough by deflecting hook 104 from its undeflected position shown into a deflected position (not shown) to permit insertion of hook 104 through loop 102. Once inclined surface 108 is inserted past loop 102, a natural resilience of the plastic material from which back cover 98 is made urges hook 104 into the locking position shown with step 110 captured below loop 102. Hook-type fastener 100 may be unlocked by pressing hook 104 toward main body 96 until step 110 is freed from loop 102 and back cover 98 may thereupon be removed from main body 96 for access to the interior of housing 94.

Depressions 112 and 114, shown in dashed line in FIG. 1 (only depression 112 is shown in FIG. 2), may be provided for finger access by a worker removing demand register 46 from register 14.

Before completing the description of the packaging of demand register 46, the following description of the electrical operation of demand register 46 is included to aid in gaining an understanding of the manner in which the packaging cooperates with the electrical operation of demand register 46 while meeting the objectives of manufacturability, maintainability and safety. Fuller descriptions of the individual elements of demand resister 46 are contained in the referenced patent applications.

Figure 5:
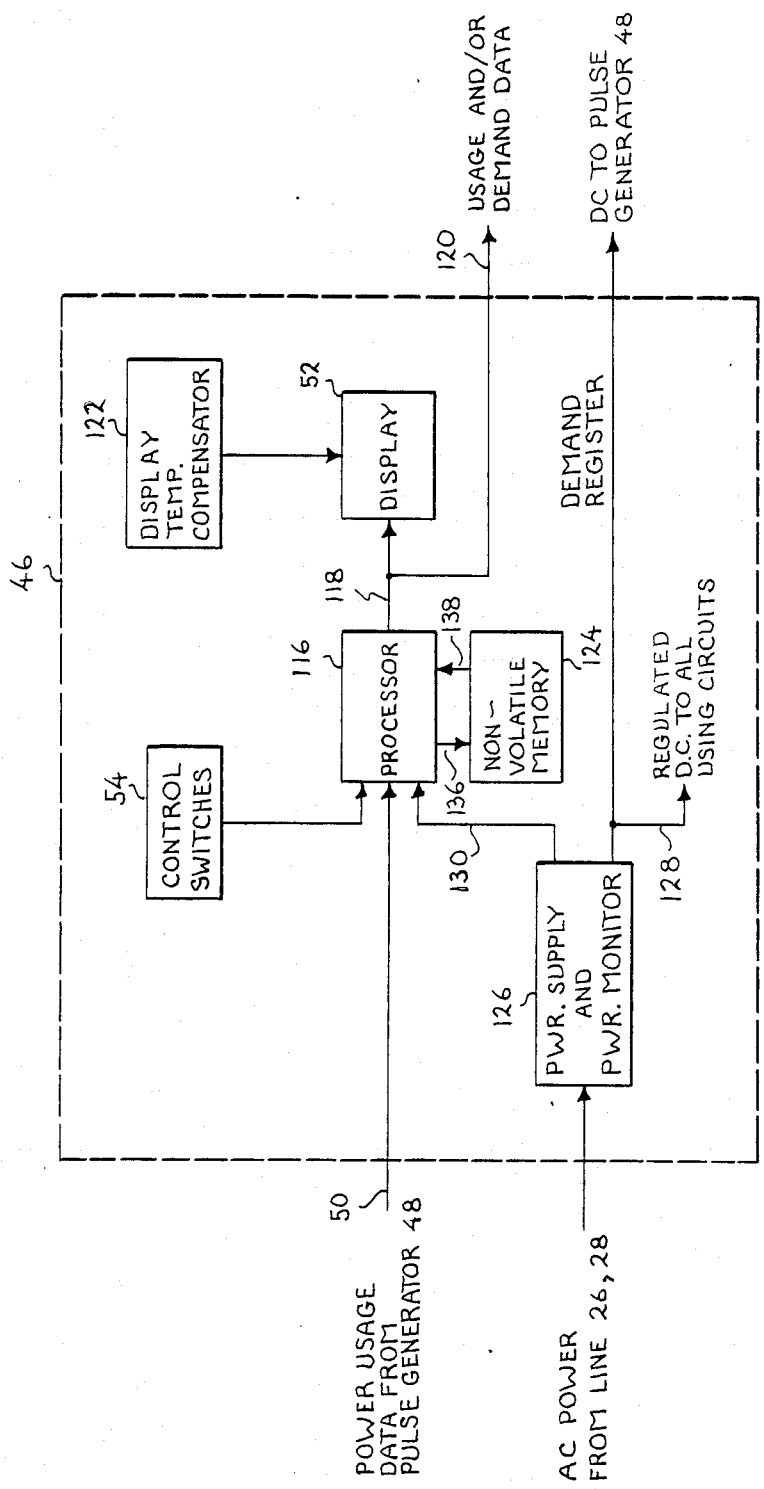
FIG. 5 is a block diagram of the demand register of FIG. 1.

Referring now to FIG. 5, there is shown a simplified block diagram of a demand register 46 according to an embodiment of the invention. The power usage signal on line 50 is fed to a processor 116 in demand register 46. Processor 116 appropriately performs calculations on the usage data to derive therefrom desired demand parameters and stores the result. In addition, processor 116 may provide an output on a line 118 suitable for driving display 52. The stored data may be transmitted on a line 120 to a remote location (not shown) for further analysis and/or billing.

Due to the extremes of environment in which electric meters may be used, display 52 may need special compensation for environmental parameters. Such special compensation may include a display temperature compensator 122 whose detailed structure and function are fully disclosed in the referenced patent applications, but are not of interest to the present disclosure.

The data which processor 116 transmits for display and/or the manner in which processor 116 operates on the input data to produce internally stored values may be modified according to selections made through control switches 54 which are of concern to the present disclosure only with regard to their mechanical interfacing with register 14.

As previously noted, processor 116 conventionally employs volatile random access memory elements which lose any data stored in them in the event of a power outage. This is usually not acceptable in an electric meter where such loss of usage and/or demand data has a negative financial impact on the utility supplying the electric power. Non-volatile storage elements such as, for example, electrically erasable programmable read only memory elements, are well known for use with processor 116. However, such non-volatile storage elements normally have relatively slow erase and write times of, for example, on the order of 10 or 20 milliseconds. This is too slow for most applications. In addition to this drawback, the power required to write such memory elements is quite high compared to that required by volatile memory elements of processor 116. Finally, a wear-out mechanism in electrically erasable programmable read only memory cells limits the number of times they can be erased and re-recorded. About 10,000 cycles of write and erase brings such a memory element to the end of its reliable useful life. Memory elements in processor 116 must, of course, be written and erased many thousands of times a day. Thus, an electrically erasable programmable read only memory would have a very short life as the operating memory for processor 116. A non-volatile memory 124 using an electrically erasable programmable read only memory elements may serve in applications in which it is erased and rewritten only when a relatively serious power outage occurs and possibly during a relatively small number of test cycles. Such operations do not occur on a frequent enough basis in demand register 46 to represent a limit on the life of demand register 46. The data can be read therefrom upon restoration of power or upon the end of test operations.

A power supply and power monitor 126 receives AC power from lines 26 and 28 for the production of a regulated DC voltage which is applied on a line 128 to all circuits in demand register 46 requiring such power. In addition to producing regulated DC power, power supply and power monitor 126 also monitors the condition of the AC power on lines 26 and 28 and, in response to certain detected conditions, applies control signals on a line 130 to processor 116 which controls the transfer of data from processor 116 to non-volatile memory 124 in the event of an apparent power outage and resets processor 116 in the event of an actual power outage.

In summary, when a momentary power outage on lines 26 and 28 causes the voltage of the unregulated DC voltage to fall below a first threshold value, a timer is started. If the unregulated DC voltage does not rise above a second threshold, slightly higher than the first threshold, before the timer times out, processor 116 is commanded to transfer billing data and programmed constants to non-volatile memory 124. A capacitor in power supply and power monitor 126 stores sufficient energy to maintain operation of demand register 46 for the duration of the timer delay, and to retain sufficient energy therein to write the billing data and programmed constants to non-volatile memory 124.

The length of the timing cycle in power supply and power monitor 126 is established at a value which is long enough to ensure that a reduction in the supply voltage probably results from a serious power outage rather than from surges, noise or a purely momentary power outage. When demand register 46 is removed from electric meter 10, or when electric meter 10 is removed from connection to line 26 and line 28, power supply and power monitor 126 recognizes the loss of supply voltage as an impending power outage and executes the process of writing the data from volatile memory in processor 116 to non-volatile memory in non-volatile memory 124. Thus, the installation-specific data which is contained in the programmed constants and the billing data are stored in non-volatile memory 124 and may be made available for writing to a non-volatile memory 124 in a replacement demand register 46 if provision is made of a suitable memory programmer which permits copying of such data from the previous non-volatile memory 124 to the replacement non-volatile memory 124. A full disclosure of the apparatus and function of power supply and power monitor 126 is contained in U.S. patent application Ser. No. 599,683, U.S. Pat. No. 4,573,141 the disclosure of which is herein incorporated by reference.

Figure 6:
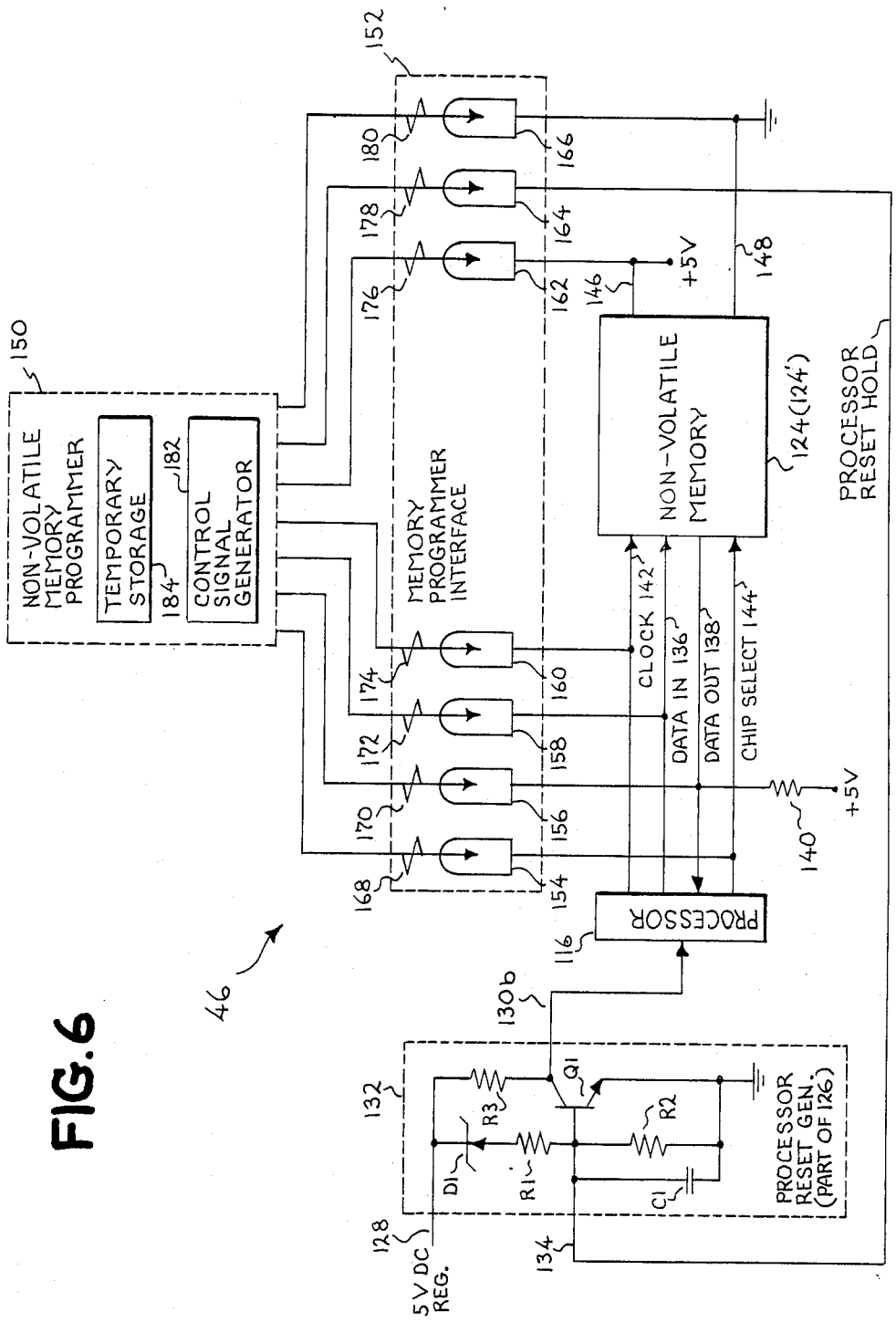
FIG. 6 is a simplified schematic and block diagram showing relevant portions of the demand register of FIG. 5 and a simplified block diagram of a non-volatile memory programmer mated together in order to illustrate the manner in which these elements are interfaced with each other.

Referring now to FIG. 6, there is shown a processor reset generator 132 which is an element of power supply and power monitor 126 having particular relevance to the present invention. It is the function of processor reset generator 132, during normal operation, to monitor the regulated DC voltage on line 128 and to apply a reset signal to processor 116 whenever the regulated DC voltage falls below a predetermined value that is no longer high enough to maintain proper operation of the processor. It is also convenient for processor reset generator 132 to produce a reset signal for processor 116 during normal power-up as the regulated DC voltage rises from zero to its normal value.

Processor reset generator 132 contains a switching transistor Q1 whose base is connected to the regulated DC supply through a breakdown, or avalanche, diode D1 in series with a resistor R1. A second resistor R2 is connected between the base of switching transistor Q1 and ground. In the preferred embodiment, breakdown diode D1 has a breakdown voltage of about 2.7 volts and resistors R1 and R2 have equal resistance values.

Figure 7:
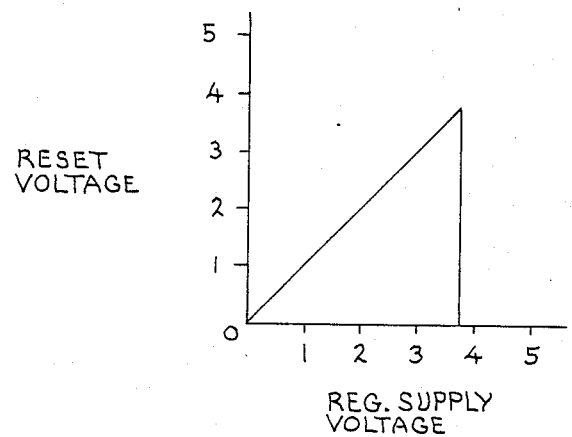
FIG. 7 is a curve illustrating the generation of a reset signal by the processor reset generator of FIG. 6.

In operation, when the regulated DC supply voltage is below a threshold value, switching transistor Q1 is cut off and the reset signal on line 130b follows the regulated DC supply voltage. At and above the threshold voltage, switching transistor Q1 is turned on and thus holds line 130b low. This relationship is illustrated in FIG. 7. When the regulated DC supply voltage decreases from its nominal value of 5 volts to a threshold value of about 3.9 volts, the voltage on line 130b jumps from about zero to about 3.9 volts and follows the supply voltage as it decreases. The reset signal, as shown in FIG. 7, therefore provides a reset signal both when the regulated DC supply voltage decays below the threshold and then increases toward normal as well as when the regulated DC supply voltage comes up following a power outage or during a normal turn-on. A processor reset hold signal line 134 is maintained in a floating condition during normal operation but may be grounded for purposes to be described when demand register 46 is removed from electric meter 10.

In normal operation, with demand register 46 installed in an electric meter 10, processor 116 supplies serial data to non-volatile memory 124 on a line 136 and receives serial data from non-volatile memory 124 on a line 138. A pull-up resistor 140 is effective to return line 138 to about +5 volts when the data output from non-volatile memory 124 is high, thus ensuring an adequate logic level. In addition, clock and chip-select signals are applied to non-volatile memory 124 on lines 142 and 144 respectively. Regulated DC voltage and ground are normally connected to non-volatile memory 124 on lines 146 and 148 respectively.

A non-volatile memory programmer 150 is capable of being connected to a removed demand register 46 when demand register 46 is removed from electric meter 10 in order to read stored data from, and write programmed data to, non-volatile memory 124. A memory programmer interface 152 permits rapid and secure connection of signals and voltages between elements within non-volatile memory programmer 150 and those within demand register 46 in order to permit non-volatile memory programmer 150 to control non-volatile memory 124. Six elongated solder pads 154, 156, 158, 160, 162 and 166 in demand register 46 are connected respectively to lines 144, 138, 136, 142, 146 and 148. A seventh elongated solder pad 164 in demand register 46 is connected to processor reset hold signal line 134. Elongated solder pads 154, 156, 158, 160, 162, 164 and 166 are formed on the same circuit board (not shown) holding non-volatile memory 124 and in a manner which facilitates interfacing therewith.

A further part of memory programmer interface 152 includes spring-pin connectors 168, 170, 172, 174, 176, 178 and 180 which are attached to, and are part of, non-volatile memory programmer 150. Spring-pin connectors 168, 170, 172, 174, 176, 178 and 180 may be aligned with, and provide electrical connection to, respective ones of elongated solder pads 154, 156, 158, 160, 162, 164 and 166. When interfaced in the manner shown in FIG. 6, non-volatile memory programmer 150 is capable of providing all power and stimulus signals required for reading data from, and for writing data to, non-volatile memory 124 (or replacement non-volatile memory 124').

Non-volatile memory programmer 150 contains a control signal generator 182 which includes conventional circuits capable of receiving manual inputs, generating regulated DC power and producing clock and chip-select signals for application to non-volatile memory 124 (or non-volatile memory 124'). In addition, control signal generator 182 contains means for formatting a data word for connection to non-volatile memory 124 on line 136 which data word is capable of selecting a read, write or erase mode of operation for noa-volatile memory 124. A temporary storage 184 in non-volatile memory programmer 150 is capable, under control of control signal generator 182, of temporarily storing programmed constants and billing data read out of non-volatile memory 124 and for copying the temporarily stored contents thereof into a replacement non-volatile memory 124' of a demand register 46. During the above reading and copying operations, control signal generator 182 applies a chip select signal on line 144 and a clock signal on non-volatile memory 124'. While reading or copying data, control signal generator 182 is effective to place a ground on processor reset hold signal line 134 for connection to processor reset generator 132. This holds the base of transistor Q1 at ground potential and maintains processor 116 in the reset condition.

Control signal generator 182 may employ any convenient devices to produce the appropriate logic level signals for controlling non-volatile memory 124 (or a replacement non-volatile memory 124') such as, for example, mechanically or electrically controlled switches. Temporary storage 184 may also be any convenient apparatus for decoding an input message prior to storage and formatting an appropriate output message. Temporary storage 184 may include, for example, a microprocessor with appropriate communications buffers. For example, non-volatile memory 124 may be a type NMC9306 non-volatile memory and processor 116 may be a type NEC 7503 microprocessor, both of which are commercially available at the time of filing of the present application. This is the same combination of equipment disclosed in U.S. patent application Ser. No. 599,683, filed 4-12-84 the disclosure of which is herein incorporated by reference.

As noted in the above-referenced patent application, problems may be encountered in passing data back and forth between non-volatile memory 124 and the particular microprocessor employed in processor 116 because of differences in the data formats for the two communicating devices. The solution described in the referenced application, which may be employed in non-volatile memory programmer 150, includes providing a communications buffer in temporary storage 184 which is effective for formatting a data message for transmission to non-volatile memory 124 (or a replacement non-volatile memory 124') which fools non-volatile memory 124 into recognizing a portion of the data message having an acceptable protocol. Similarly, the communications buffer performs selective shift and ignore operations on data received from non-volatile memory 124 to convert the data protocol into one which a microprocessor in temporary storage 184 is capable of accepting.

After the data read out from non-volatile memory 124 into temporary storage in temporary storage 184 has been copied into a replacement non-volatile memory 124', the ground signal on processor reset hold signal line 134 is removed. This permits processor reset generator 132 to generate a reset signal which, among other things, reads the copied contents of non-volatile memory 124 into processor 116 in order to enable testing of demand register 46. When demand register 46 is physically removed from non-volatile memory programmer 150 and power is thereby cut off from demand register 46, the apparent power outage is effective in the manner described to erase non-volatile memory 124 and store the data therein. When demand register 46 is installed in an electric meter, and the voltage applied thereto rises above a predetermined value, the stored content of non-volatile memory 124 is returned to processor 116.

Returning now to FIG. 3 to complete the mechanical description of demand register 46, it should first be noted that most of the assembly of demand register 46 is performed while main body 96 rests on its face by dropping in the components into preformed, generally molded-in, locations. A glass or plastic window 186 is disposed in a recess 188 behind a rectangular display opening 190. Display 52, which is a generally flat device, rests behind window 186 with its characters (when enabled) visible through rectangular display opening 190. A display retainer 192, which is preferably a molded plastic element, is disposed at the rear of display 52 for retaining display 52 in its operational position adjacent window 186. Display retainer 192 includes one or more support bosses 194 extending rearward therefrom.

Each of the three control switches 54 is mechanically similar, except for its location and function. For purposes of illustration, it suffices to describe a test switch 196. A tubular channel 198, integrally molded into main body 96, opens into an enlarged portion 200 at its inner end. A switch actuator 202 includes an actuator shaft 204 slideably fittable within tubular channel 198 and an enlarged cylindrical portion 206, integrally formed with actuator shaft 204 and loosely fittable within enlarged portion 200. A conical inner opening 208 joins an inner end of enlarged portion 200. A narrow end of a resilient frusto-conical spring 210 is disposed within conical inner opening 208 and adjacent to an end of actuator shaft 204. A flange 212 about a large end of resilient frusto-conical spring 210 overlies a clamping flange 214 integrally molded in main body 96. Resilient frusto-conical spring 210 may be a conventional device which provides tactile feedback when it is compressed; that is, at a certain point in its compression, resilient frusto-conical spring 210 provides the equivalent of an overcenter release similar to that experienced in a typewriter key. In addition, a piece of conductive material, such as, for example, a piece of conductive rubber (not shown in FIG. 3), may be positioned within resilient frusto-conical spring 210 for making circuit contact, as will be explained hereinafter in greater detail.

Figure 8:
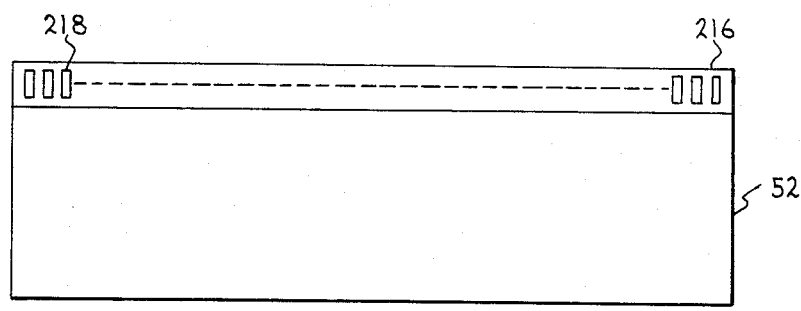
FIG. 8 is a top view of a display illustrating a contact area having metallic contact pads thereon.

Referring now to FIG. 8, a rear view of display 52 shows a contact area 216, along one edge of display 52, which includes a plurality of metallic contact pads 218 through which electrical signals are connected to display 52 for control thereof. As is conventional, metallic contact pads 218 may be formed by conventional printed circuit techniques which are not of concern here. Returning now to FIG. 3, a printed circuit board 220 is disposed atop support bosses 194 and clamping flanges 214, as well as upon other possible supporting bosses (not shown), and is retained firmly in position using conventional retaining means such as, for example, a plurality of screws 222 (only one of which is shown). A contact area 224 on a surface of printed circuit board 220 is a mirror image of contact area 216 on display 52. The contact pads of contact area 224 are aligned with metallic contact pads 218 (see FIG. 8) on contact area 216. A rectangular slot 226 is formed between a side 228 of display retainer 192 and a facing side 230 and between contact area 216 and contact area 224. A rectangular contact strip 232 is disposed in rectangular slot 226 with a first end 234 contacting contact area 216 and a second end 236 contacting contact area 224.

Rectangular contact strip 232 is of the tape having a core 238 in which parallel longitudinal resilient connductive strands are encapsulated within, and insulated from each other by, a resilient matrix. Since the conductive strands in core 238 are substantially parallel to each other, a pattern of voltages is set up at first end 234 which is a direct image of the pattern of voltages existing at second end 236. Thus, control signals for display 52, generated on printed circuit board 220, are connected directly to appropriate areas of display 52 without the need or expense of a connector to convey such signals therebetween. In addition, the installation of rectangular contact strip 232 requires only dropping it into rectangular slot 226 during assembly. Rectangular contact strip 232 is made slightly longer than the spacing between contact area 216 and contact area 224 whereby, when printed circuit board 220 is installed by tightening screws 222, a slight longitudinal compression of rectangular contact strip 232 ensures a stable resiliently urged contact for reliable connection over a substantial period of time.

Except for display 52 and control switches 54, all elements of demand register 46 are mounted on printed circuit board 220. For the present discussion, only the mounting of non-volatile memory 124 on printed circuit board 220 is of concern and therefore shown and described, it being understood that the remainder of the components making up demand register 46 are also included on printed circuit board 220 but are not shown to avoid clutter.

Figure 9:
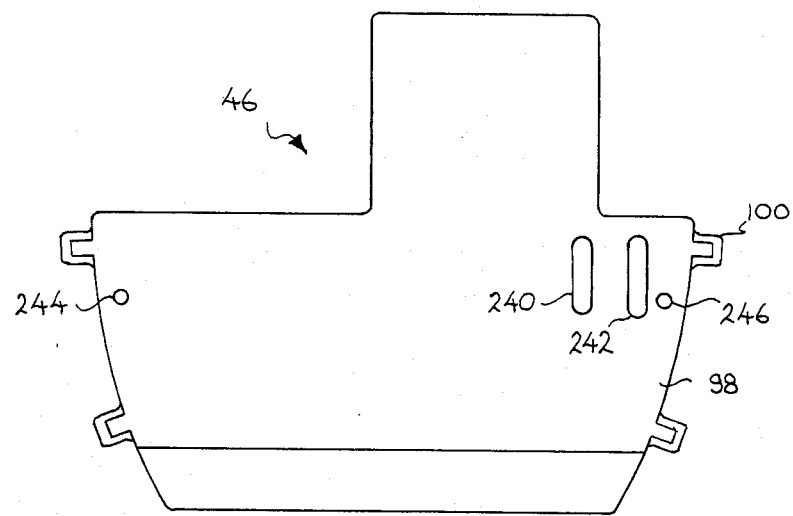
FIG. 9 is a rear view of a demand register according to an embodiment of the invention.
Figure 10:
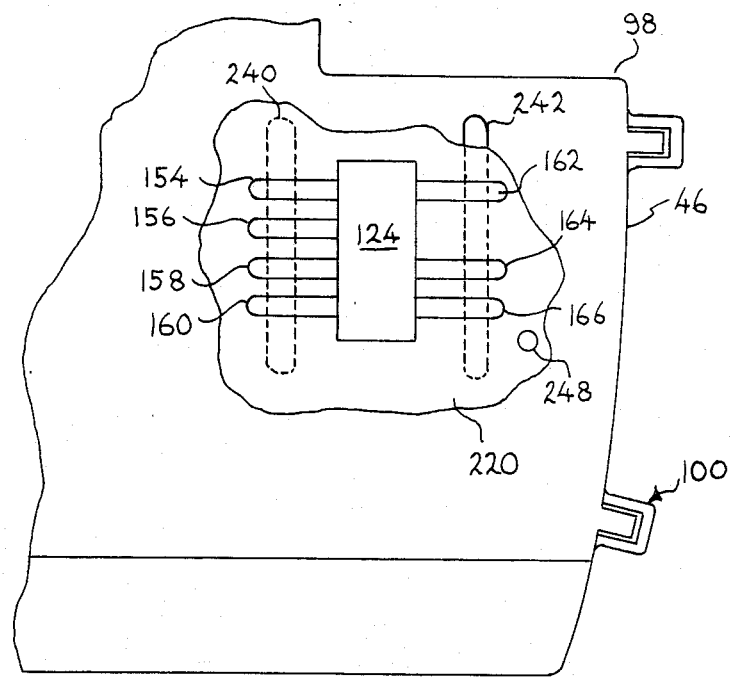
FIG. 10 is a closeup view of a portion of the rear of the demand register of FIG. 9 in which part of the back cover is cut away to show the cooperation between elongated solder pads on the circuit board and slots in the back cover.

Referring now to the rear view of demand register 46 shown in FIGS. 9 and 10, first and second parallel elongated slots 240 and 242 are aligned over elongated solder pads 154-160 and elongated solder pads 162-166 respectively disposed on printed circuit board 220. First and second alignment holes 244 and 246 are disposed in back cover 98 as part of a mechanical arrangement for aligning demand register 46 with non-volatile memory programmer 150 (not shown in FIGS. 9 and 10). Printed circuit board 220 also contains an alignment hole 248 positioned in alignment with alignment hole 246. It will be noted that elongated solder pads 154-166 extend laterally past elongated slots 240 and 242 whereby a probe (not shown), inserted straight into elongated slot 240 or elongated slot 242, is capable of contacting a selected one of elongated solder pads 154-166.

Figure 11:
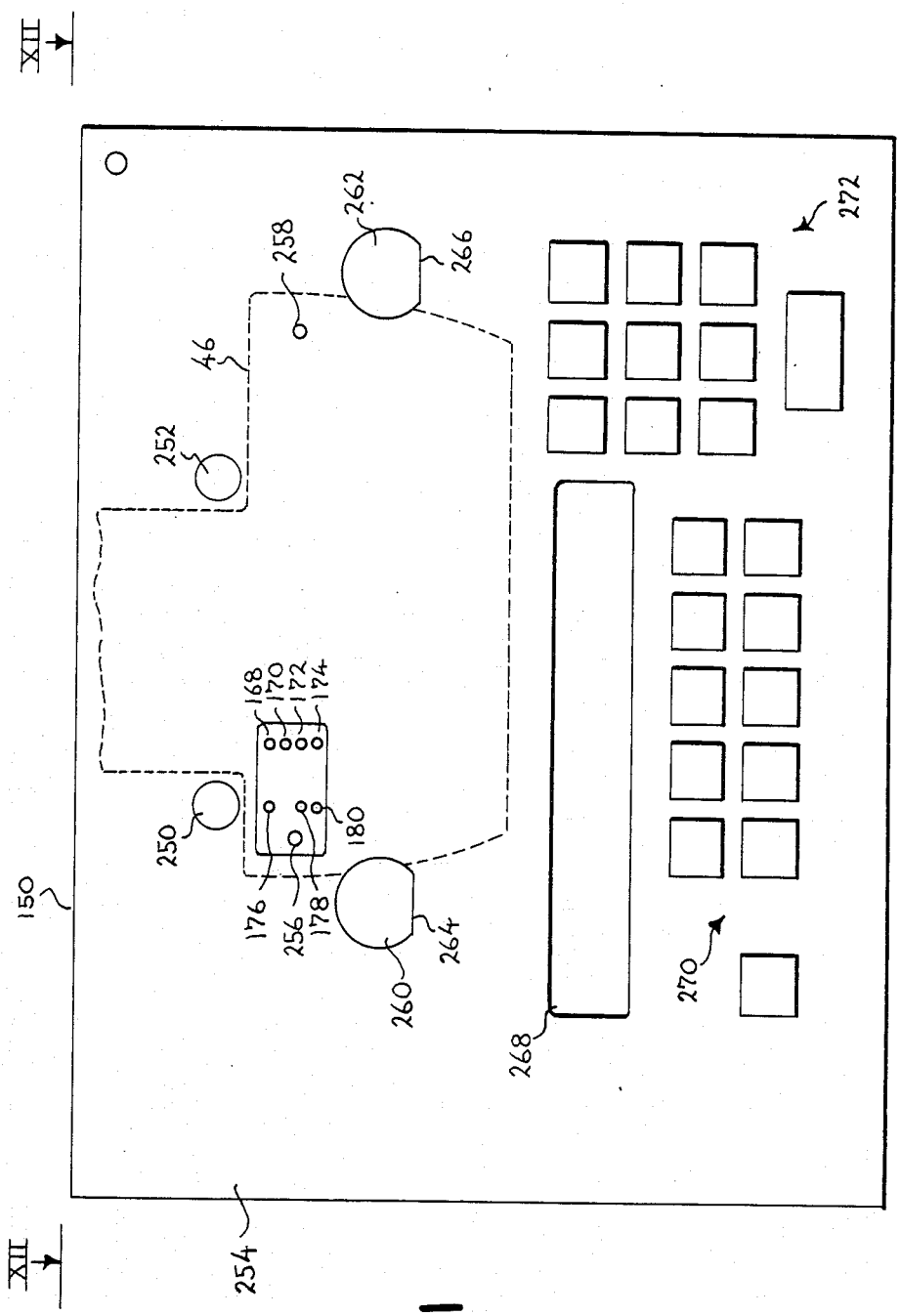
FIG. 11 is a top view of the non-volatile memory programmer illustrated schematically in FIG. 6.
Figure 12:
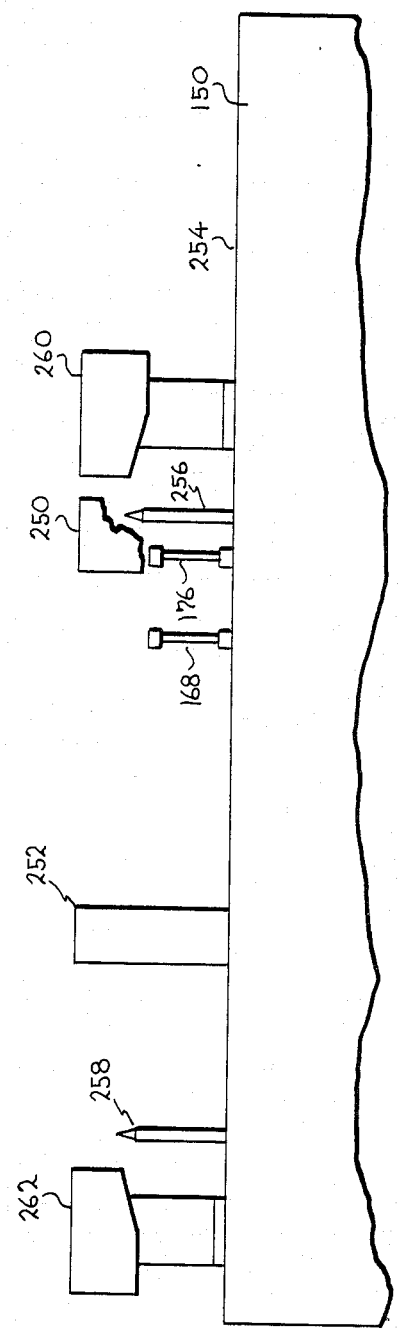
FIG. 12 is a side view of the non-volatile memory programmer taken along XII—XII of FIG. 11.

Referring now to a front view of non-volatile memory programmer 150 in FIG. 11 and a side view thereof in FIG. 12, first and second coarse alignment posts 250 and 252 extend upward from a panel 254. An outline of a demand register 46, positioned face upward on coarse alignment post 252 in operational contact with coarse alignment posts 250 and 252 is shown in dashed line in FIG. 11. An alignment pin 256 adjacent to spring-pin connectors 168-180 is generally aligned with alignment hole 246 in back cover 98 and alignment hole 248 in printed circuit board 220 (see FIGS. 9 and 10) when the illustrated contact is made with coarse alignment posts 250 and 252. Similarly, an alignment pin 258 is generally aligned with alignment hole 244 (FIG. 9) in the condition shown.

A pair of rotary clamping knobs 260 and 262 are disposed adjacent to opposed sides of demand register 46. A flat side 264 on rotary clamping knob 260 and a corresponding flat side 266 on rotary clamping knob 262 may be rotated toward demand register 46 to permit placing demand register 46 into, and removing it from, the dashed-line position shown. In order to lock demand register 46 in the programming position on panel 254, demand register 46 is pressed downward toward panel 254 against an opposing spring force provided by spring-pin connectors 168-180 until alignment pins 256 and 258 have entered their respective alignment holes and firm contact is achieved between ends of spring-pin connectors 168-180 and respective ones of elongated solder pads 154-166. Rotary clamping knobs 260 and 262 may then be rotated into the locking positions shown to retain demand register 46 in the programming position.

Referring now specifically to FIG. 11, panel 254 may include suitable indicators and controls to aid the operator both in troubleshooting of a demand register 46 and controlling the reading and writing of data in non-volatile memory 124. For example, a display 268 may be included for displaying data received from, or written to, non-volatile memory 124. A plurality of function keys 270 may be included in panel 254 for selecting a mode, applying power to demand register 46, or for other purposes. A numeric keypad 272 may also be included in panel 254 to permit direct program input either to temporary storage 184 within non-volatile memory programmer 150 or directly to non-volatile memory 124 in demand register 46. The exact functions of display 268, function key 270 and numeric keypad 272 are not of concern to the present invention and a further discussion thereof is therefore omitted Having described preferred embodiments of the invention with reference to the accompanying drawings, it is to be understood that the invention is not limited to those precise embodiments, and that various changes and modifications may be effected therein by one skilled in the art without departing from the scope or spirit of the invention as defined in the appended claims

What is claimed is:

1. A modular demand register for an electric meter comprising:
   a non-conductive housing;

said housing including at least one recess for receiving a display;

a display in said at least one recess;

a circuit board in said housing containing a substantial part of an electronic circuit of said demand register;

means for affixing said circuit board in said housing generally parallel to, and displaced from, said display;

means for interconnecting said circuit board and said display for operation of said display;

a non-conducting back cover for said housing, said housing and said back cover being effective for enclosing all conductive parts of said demand register which may receive power when said demand register is in an operational position within an electric meter;

means for snapping said back cover in place on said housing whereby assembly of said demand register is simplified;

a plurality of parallel pins rigidly affixed to one of said demand register and said electric meter and positioned for plugging into a connector rigidly affixed to the other of said demand register and said electric meter during insertion of said demand register into said electric meter;

said plurality of parallel pins including at least a first pin having a first length and at least a second pin having a second length;

said first length being substantially less than said second length whereby said at least a first pin is electrically connected to said connector after said at least a second pin is connected during insertion of said demand register into said electric meter and said at least a first pin is disconnected from said connector before said at least a second pin is disconnected from said connector during removal of said demand register from said electric meter; and said at least a first pin being connected to provide power to at least a first circuit in said demand register and said at least a second pin being connected to provide signals other than power to at least a second circuit in said demand register whereby connection and disconnection of said signals other than power are always performed before connection and disconnection of power respectively.

2. A modular demand register according to claim 1 wherein said means for interconnecting includes:

a first plurality of conductive contact pads on said display facing said circuit board;

a second plurality of conductive contact pads on said circuit board facing corresponding ones of conductive contact pads of said first plurality of conductive contact pads;

said first plurality and said second plurality being separated by a first distance;

a contact strip between said first plurality and said second plurality; and said contact strip being of a type having a plurality of resilient conductors longitudinally disposed within a resilient insulating matrix, said resilient conductors being effective for producing a voltage pattern at an end thereof in contact with said first plurality of conductive contact pads which is the image of a voltage pattern at said second plurality of conductive contact pads whereby interconnection between corresponding ones of said first plurality and said second plurality is achieved.

3. A modular demand register according to claim 1, further comprising a display retainer in said at least one recess, said display retainer including means for retaining said display in said at least one recess, said display retainer having a dimension less than a dimension of said at least one recess whereby a slot is formed between a side of said at least one recess and a facing side of said display retainer, said means for interconnecting further including a first plurality of conductive contact pads on said display at a first end of said slot facing said circuit board;

a second plurality of conductive contact pads on said circuit board at a second end of said slot facing corresponding ones of conductive contact pads of said first plurality of conductive contact pads;

said first plurality and said second plurality being separated by a length of said slot;

a contact strip in said slot between said first plurality and said second plurality; and said contact strip being of a type having a plurality of resilient conductors longitudinally disposed within a resilient insulating matrix, said conductors being effective for producing a voltage pattern at an end thereof in contact with said first plurality of conductive contact pads which is the image of a voltage pattern at said second plurality of conductive contact pads whereby interconnection between corresponding ones of said first plurality and said second plurality is achieved.

4. A modular demand register according to claim 3 wherein a length of said contact strip is greater than said length of said slot and said length of said contact strip is resiliently compressed to a value substantially equal to said length of said slot to provide a resiliently urged contact between corresponding ones of said first plurality and said second pluralities.

5. A register for an electric meter comprising:

a support structure;

a plate on said register;

means for supporting said plate on said support structure;

a modular electronic demand register;

a cavity behind said plate for receiving said modular demand register;

a first slot in said plate;

said first slot including first and second parallel edges;

at least a second slot in said plate extending contiguously from said first slot in a direction parallel to said first and second parallel edges;

said second slot including third and fourth edges parallel to said first and second edges;

first and second locking notches in said plate extending transversely contiguously from said first and second edges respectively;

a housing on said modular demand register;

said housing including at least first, second, third and fourth guide surfaces extending outward therefrom;

said first, second, third and fourth guide surfaces being guidably slideable on said first, second, third and fourth edges for guiding said modular demand register into said cavity;

first and second locking ramps on said housing;

said plate being free to permit outward deflection thereof in the vicinity of said first and second locking notches;

said first and second locking ramps being positioned to deflect said plate outward during insertion of said modular demand register into said electric meter and to lockingly engage said first and second locking notches when said modular demand register is in its operational position;

an electrical connector in said register;

a plurality of connector pins in said modular demand register; and a cooperation between said first, second, third and fourth edges and said first, second, third and fourth guide surfaces being effective to provide guidance for guiding a mating of said connector pins into said electrical connector during insertion of said modular demand register in said cavity.

6. A register according to claim 5 wherein said housing includes first and second depressions therein, said first and second depressions being positioned for access to facilitate removal of said modular demand register from said cavity.

7. A register according to claim 5 wherein said plate further includes first and second finger tabs, said first and second finger tabs permitting manual outward deflection of said plate including said first and second locking notches sufficiently to disengage said locking notches from said locking ramps whereby said modular demand register may be removed from said cavity.

* * * * *